(12) United States Patent
Furuhata et al.

(10) Patent No.: US 7,301,423 B2
(45) Date of Patent: Nov. 27, 2007

(54) SURFACE ACOUSTIC WAVE ELEMENT AND MANUFACTURING METHOD THEREOF

(75) Inventors: Makoto Furuhata, Suwa (JP); Kenji Goto, Suwa (JP); Hisakatsu Sato, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 61 days.

(21) Appl. No.: 11/282,752

(22) Filed: Nov. 21, 2005

(65) Prior Publication Data

US 2006/0114081 A1 Jun. 1, 2006

(30) Foreign Application Priority Data

Dec. 1, 2004 (JP) ............................. 2004-348235
Aug. 29, 2005 (JP) ............................. 2005-247274

(51) Int. Cl.
*H03H 9/25* (2006.01)

(52) U.S. Cl. .................. 333/193; 310/313 B; 257/416

(58) Field of Classification Search ................ 333/193; 310/313 R, 313 B; 257/416
See application file for complete search history.

(56) References Cited

U.S. PATENT DOCUMENTS 4,647,881 A * 3/1987 Mitsutsuka ................. 333/194
5,166,646 A * 11/1992 Avanic et al. .......... 331/107 A

FOREIGN PATENT DOCUMENTS

| EP | 1 672 789 A1 | 6/2006 |
| EP | 1 675 261 A1 | 6/2006 |
| GB | 2 182 514 A | 5/1987 |
| JP | 61-94409 A | 5/1986 |
| JP | 10-107209 A | 4/1998 |

OTHER PUBLICATIONS van Zeijl et al., "FM Radio Receiver Front-End Circuitry with On-Chip SAW Filters", IEEE Trans. on Consumer Electronics, vol. 35, No. 3, Aug. 1989, pp. 312-319.*
J. H. Visser, "Surface Acoustic Wave Filters in ZnO-Sio2-Si Layerec Structures", Ultrasonic Simposium, 1989., Proceedings, IEEE 1989, pp. 195-200. vol. 1.
Yunseong EO et al., "Reference SAW Oscillator on Quartz-on-Silicon (QoS) Wafer for PolyLithic Integration of True Single Chip Radio", Electronic Devices Meeting, Dec. 5, 1999, IEDM Technical Digest International, pp. 761-764.
J. H. Visser et al., "On-Chip SAW Filters in Integrated Radio Systems", Proceedings of the International Conference on Consumer Electronics (ICCE), Jun. 6, 1989, pp. 90-91.

* cited by examiner

*Primary Examiner*—Seungsook Ham
(74) *Attorney, Agent, or Firm*—Oliff & Berridge, PLC

(57) ABSTRACT

A surface acoustic wave (SAW) element including a semiconductor substrate on which a semiconductor wiring region and a SAW region are formed alongside in a same plane, a metal wiring formed in the semiconductor wiring region, an insulating layer including the metal wiring and formed throughout on surfaces of the semiconductor wiring region and the SAW region, a most upper layer of the insulating layer formed so as to have a one flat surface throughout the semiconductor wiring region and the SAW region and a uniform thickness from an upper face of the semiconductor substrate, a piezoelectric layer formed on the most upper layer of the insulating layer and an inter digital transducer (IDT) formed on the piezoelectric layer in the SAW region.

1 Claim, 8 Drawing Sheets

SURFACE ACOUSTIC WAVE ELEMENT AND MANUFACTURING METHOD THEREOF

BACKGROUND OF THE INVENTION

1. Technical Field

The present invention relates to a surface acoustic wave (SAW) element formed on a semiconductor substrate and a manufacturing method thereof.

2. Related Art

Ultrasonics Simposium 1989 Proceedings IEEE1989, 3-6 Oct. 1989, Pages 195-200 Vol. 1.: Visser, J. H; Vellekoop, M. J; Venema, A; van der Drift, E; rek, P. J. M.; Nederlof, A. J.; Nieuwenhuizen, M. S. is an example of related art. The example describes a surface acoustic wave (SAW) element and a manufacturing method thereof. To manufacture the SAW element, firstly, an epitaxial layer and a $SiO_2$ layer are sequentially formed on a semiconductor substrate such as a Si substrate and the like. A semiconductor wiring region and a SAW region are arranged alongside each other in a plane on the $SiO_2$ layer. In the SAW region, a comb-shaped inter digital transducer (IDT) made of aluminum and a piezoelectric layer (ZnO) are formed on the $SiO_2$ layer which is thicker than the $SiO_2$ layer in the semiconductor wiring region. In the semiconductor wiring region, an aluminum wiring layer and an insulating layer made of silicon nitride ($Si_3N_4$) are formed on the $SiO_2$ layer.

According to the related art example, a height of the most upper layer in the semiconductor wiring region and a height of the $SiO_2$ layer in the SAW region are different. More specifically, the most upper layer in the semiconductor wiring region is lower than the upper face of the $SiO_2$ layer in the SAW region. Therefore, when the surface of the $SiO_2$ layer in the SAW region is polished by chemical and mechanical polishing (CMP) and the like in order to make the surface flat and smooth for forming the IDT there, it was difficult to obtain a uniform thickness for the $SiO_2$ layer in the SAW region where the IDT is formed. It is known that the speed (acoustic velocity) of the acoustic wave propagating the $SiO_2$ layer in the SAW region differs depending on the thickness of the $SiO_2$ layer where the IDT is formed. Since frequency is proportional to the acoustic velocity, if a region where the acoustic velocity is different from other regions exists in the element, this could lead to a problem that a stable frequency characteristic and a sharp band-pass property cannot be obtained.

SUMMARY

An advantage of the invention is to provide a surface acoustic wave (SAW) element in which a SAW device is formed on a semiconductor substrate and having fine frequency and band-pass characteristics, and to provide a manufacturing method thereof.

According to a first aspect of the invention, a surface acoustic wave (SAW) element includes a semiconductor substrate on which a semiconductor wiring region and a SAW region are formed alongside in a same plane, a metal wiring formed in the semiconductor wiring region, an insulating layer including the metal wiring and formed throughout on surfaces of the semiconductor wiring region and the SAW region, a most upper layer of the insulating layer formed so as to have a one flat surface throughout the semiconductor wiring region and the SAW region and a uniform thickness from an upper face of the semiconductor substrate, a piezoelectric layer formed on the most upper layer of the insulating layer and an inter digital transducer (IDT) formed on the piezoelectric layer in the SAW region.

In this case, the semiconductor substrate may be made of a Si layer. The insulating layer may be a $SiO_2$ layer and the piezoelectric layer may be a ZnO layer and the like.

According to the first aspect of the invention, the insulating layer is formed in the one flat plane throughout the semiconductor wiring region and the SAW region. Therefore, the IDT can be formed on the flat and smooth surface. Accordingly, it is possible to provide the surface acoustic wave element having a stable frequency characteristic and a sharp band-pass characteristic.

According to a second aspect of the invention, a method of manufacturing a surface acoustic wave (SAW) element in which a semiconductor wiring region and a SAW region are formed alongside in a same plane on a semiconductor substrate includes a step of arranging the surface acoustic wave element in a latticed pattern in a wafer, a step of arranging the semiconductor wiring region and the SAW region formed in the adjacent surface acoustic wave element in a checkered pattern, a step of forming an insulating layer throughout on surfaces of the semiconductor wiring region and the SAW region so as to have a one flat surface and a uniform thickness from an upper face of the semiconductor substrate, a step of forming a piezoelectric layer on a most upper layer of the insulating layer; and a step of forming inter digital transducer (IDT) on the piezoelectric layer in the SAW region.

Here, the checkered pattern means that two semiconductor wiring regions or two SAW regions do not lie next to each other in the same side but the semiconductor wiring region and the SAW region lie next to each other.

The insulating layer formed to have a one flat surface and a uniform thickness means that the insulating layer has a leveled face and a thickness from the semiconductor substrate surface to the most upper insulating layer surface.

It is known in the semiconductor manufacturing process that a region where the thickness partially differs from other region could be formed if the insulating layer in the less wiring density SAW region is formed in a large area. However, according to the second aspect of the invention, the SAW region is surrounded by the semiconductor wiring region by arranging the semiconductor wiring region and the SAW region in the above-described checkered pattern in the surface acoustic wave (SAW) element. Therefore, it is possible to form the flat and smooth insulating layer with a uniform thickness on the surfaces of the SAW region and the semiconductor wiring region where a wiring density is different each other. The detail will be described in the description of the embodiments.

It is preferable that a metal wiring layer is separately formed from the metal wiring on a peripheral of the surface acoustic wave element provided most outside in the wafer, the metal wiring layer having a substantially same wiring density as a wiring density of the metal wiring formed in the semiconductor wiring region.

According to the second aspect of the invention, the semiconductor wiring region and the SAW region are arranged in the checkered pattern as described above. In this case, the SAW region could be provided on the most outside area in the wafer. However, by forming the metal wiring layer having the substantially same wiring density as that of the metal wiring formed in the semiconductor wiring region on the peripheral of the SAW region, it is possible to level the wiring density in the surface acoustic wave element placed on an inner side of the wafer and in the surface acoustic wave element placed on the most outer side of the wafer since the SAW region is surrounded by the semiconductor wiring region and the metal wiring layer that have substantially the same wiring density. Accordingly, the flat and smooth insulating layer with a uniform thickness can be formed on the surfaces of the SAW region and the semiconductor wiring region where the wiring density is different each other.

In this case, the method of manufacturing a surface acoustic wave element may further include a step of forming the metal wiring on the surface of the semiconductor wiring region of the semiconductor substrate, a step of forming an insulating layer that includes the metal wiring throughout on a surface of the metal wiring and the surface of the SAW region, a step of polishing the insulating layer till it has a predetermined thickness, a step of polishing the most upper layer of the insulating layer such that the one flat plane is formed throughout the semiconductor wiring region and the SAW region, a step of forming a piezoelectric layer on the most upper layer of the insulating layer and a step of forming an IDT on the piezoelectric layer.

If the surface acoustic wave elements are arranged in the above-mentioned way in the wafer and with the above-described manufacturing method is applied, it is possible to form the uniform insulating layer having the flat one plane by hitherto known semiconductor manufacturing process without increasing the number of the manufacturing process.

Moreover, the method of manufacturing a surface acoustic wave element may further include a step of forming the metal wiring on the surface of the semiconductor wiring region of the semiconductor substrate, a step of forming an insulating layer that includes the metal wiring throughout on a surface of the metal wiring and the surface of the SAW region, a step of polishing a surface of the insulating layer such that the insulating layer has a uniform thickness and a one flat plane, a step of forming a piezoelectric layer in the SAW region of the polished insulating layer and a step of forming an IDT on the piezoelectric layer.

In this case, the piezoelectric layer is formed in the SAW region of the insulating layer that is polished to have the one flat surface and the uniform thickness, and the IDT is then formed. Therefore, it is possible to provide the surface acoustic wave element having the stable frequency characteristic and the sharp band-pass characteristic because the piezoelectric layer is formed on the flat, smooth and uniform insulating layer.

BRIEF DESCRIPTION OF THE DRAWINGS

The invention will be described with reference to the accompanying drawings, wherein like numbers reference like elements.

DESCRIPTION OF THE EMBODIMENTS

Embodiments of the invention will now be described with reference to the drawings.

Figure 1:
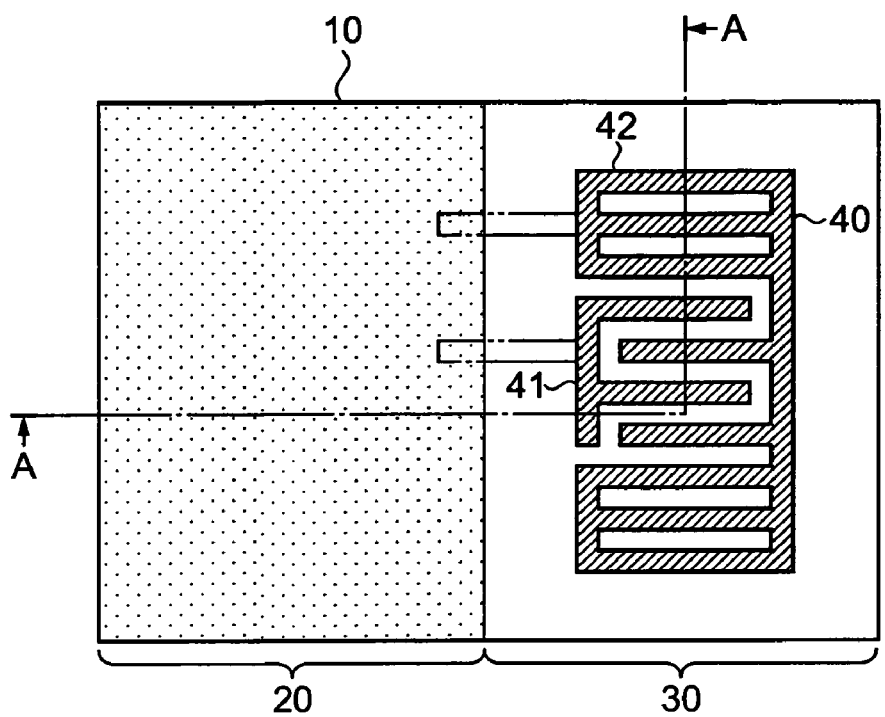
FIG. 1 is a plan view of a surface acoustic wave element according to a first embodiment of the invention showing its structure.
Figure 2:
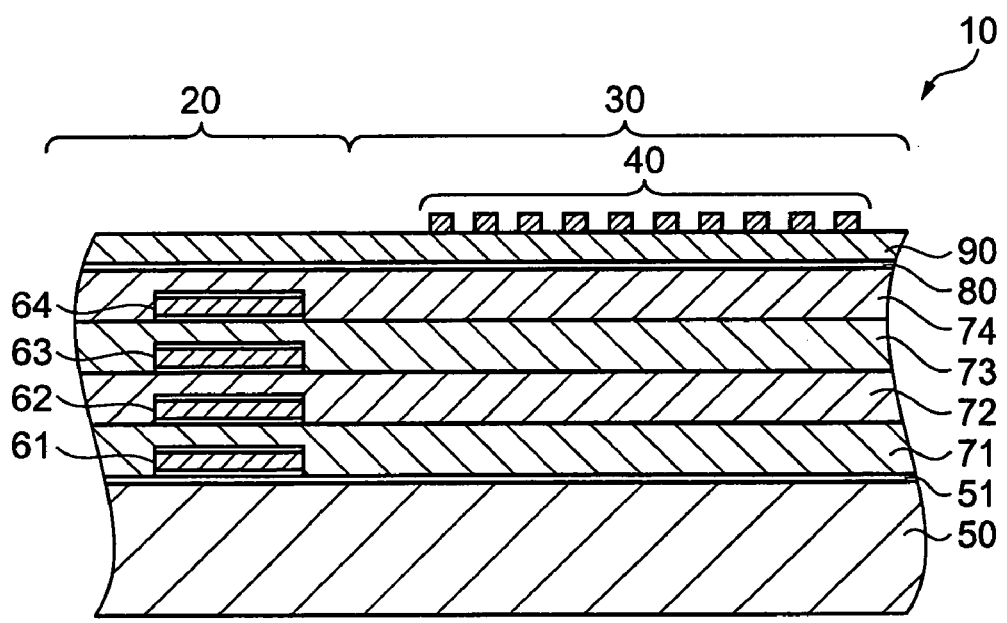
FIG. 2 is a partial sectional view of the surface acoustic wave element according to the first embodiment of the invention showing its structure.
Figure 7:
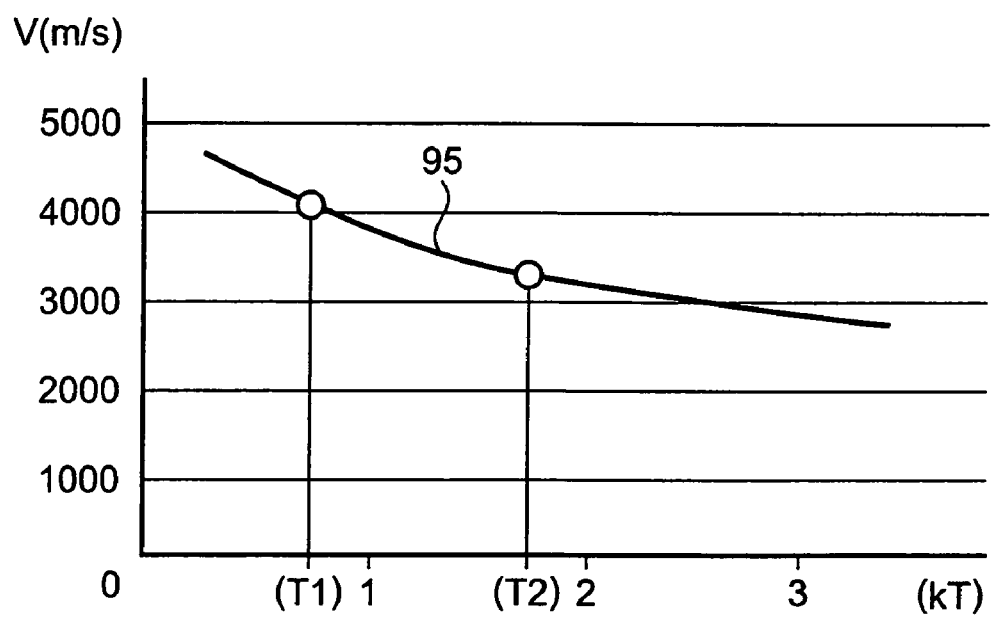
FIG. 7 is a graph showing a relation between an acoustic velocity V propagating through the surface acoustic wave element according to the first embodiment and a thickness of an insulating layer.
Figure 8:
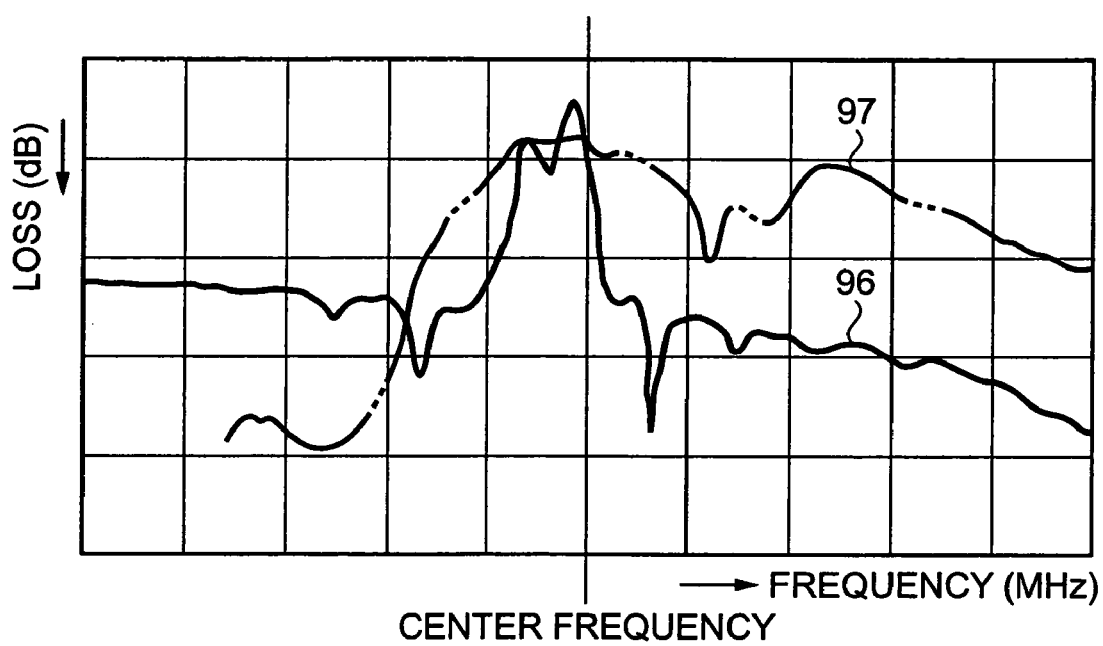
FIG. 8 is a graph showing a band-pass characteristic of the surface acoustic wave element (a SAW filter) according to the first embodiment.

FIG. 1 and FIG. 2 show a surface acoustic wave element according to a first embodiment. FIGS. 3 through 6 show a manufacturing method of the surface acoustic wave element according to the first embodiment. FIG. 7 and FIG. 8 are graphs showing characteristics of the surface acoustic wave element. FIG. 9 shows a manufacturing method of a surface acoustic wave element according to a second embodiment. FIG. 10 shows a third embodiment and FIG. 11 shows a hitherto known other embodiment.

First Embodiment

FIG. 1 is a plan view of the surface acoustic wave element according to the first embodiment. As shown in FIG. 1, a surface acoustic wave element 10 has a semiconductor wiring region 20 and a SAW region 30 that are formed to be arranged adjacent each other in the same plane on a Si layer 50 (see FIG. 2) which is a rectangular semiconductor substrate. Unshown metal wirings (see FIG. 2) are formed in four layers in the semiconductor wiring region 20. A comb-shaped IDT 40 is formed in a most upper layer in the SAW region 30.

The IDT 40 is made of aluminum and has an input-side electrode 41 and an output-side electrode 42 that mesh each other. The input-side electrode 41 and the output-side electrode 42 respectively have an terminal for input and output, and these terminals are coupled with predetermined metal wirings formed in an unshown semiconductor region.

FIG. 2 is a partial sectional view of the surface acoustic wave element 10 according to the embodiment along the line A-A in FIG. 1. As shown in FIG. 2, the surface acoustic wave element 10 has the Si layer 50 which is the semiconductor substrate, a boron-phosphor-silicate glass or BPSG layer 51 (a boron-phosphor dope oxide film layer), an aluminum (Al) wiring 61 which is a metal wiring and an insulating layer 71 made of $SiO_2$. The BPSG layer 51 is formed on the surface of the Si layer 50 in order to make the surface of the Si layer 50 smooth and flat. The insulating layer 71 includes the Al wiring 61 and is formed on the surface of the Si layer 50. The surface acoustic wave element 10 further includes an Al wiring 62 formed on the upper face of the insulating layer 71, an insulating layer 72 formed on the upper face of the Al wiring 62, an Al wiring 63 formed on the upper face of the insulating layer 72, an insulating layer 73 formed on the upper face of the Al wiring 63, an Al wiring 64 formed on the upper face of the insulating layer 73 and an insulating layer 74 formed on the upper face of the Al wiring 64. In this way, the Al wirings and the insulating layers are alternatively formed in layers.

The upper faces of the insulating layers 71-74 are polished so as to have smooth and flat surfaces and the uniform thickness. Furthermore, a protection layer 80 made of silicon nitride ($Si_3N_4$) is formed so as to cover the most upper insulating layer 74. A piezoelectric layer 90 made of ZnO is further formed so as to cover the upper face of the protection layer 80. The upper face of the Si layer 50 is divided into two regions (see FIG. 1): one is the semiconductor wiring region 20 where the Al wirings 61-64 are formed and the other is the SAW region 30.

The IDT 40 made of aluminum is formed on the upper face of the piezoelectric layer 90 in the SAW region 30. The IDT 40 is the comb-shaped electrode shown in FIG. 1.

Unshown circuit elements such as transistor are formed in the Si layer 50. The Al wirings 61-64 are provided so as to couple these circuit elements, and predetermined connections are made through via-holes (not shown in the figures) and the like. The input-side terminal and the output-side terminal of the IDT 40 are coupled with corresponding wirings among the Al wirings 61-64 though they are not shown in the figures. Only a part of the Al wirings are shown in FIG. 2 and other unshown Al wirings exist though they are not shown in the figure.

As described above, the semiconductor wiring region 20 and the SAW region 30 are formed on the semiconductor substrate (the Si layer 50), the flat and smooth insulating layer and the piezoelectric layer are formed so as to cover the both region, and the IDT 40 is formed in the SAW region 30. This is a first gist of the embodiment of the invention.

Next, the manufacturing method of the surface acoustic wave element 10 according to the first embodiment is described with reference to the drawings.

Figure 3:
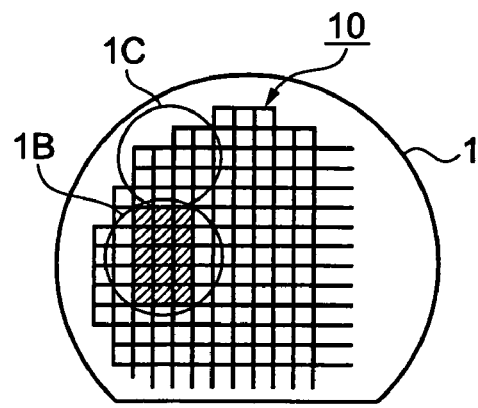
FIG. 3 is a plan view showing a layout of a wafer on which the surface acoustic wave element according to the first embodiment of the invention is formed.

FIG. 3 is a plan view showing a layout of a wafer 1 on which the surface acoustic wave element 10 according to the first embodiment is formed. As shown in FIG. 3, the surface acoustic wave element 10 is provided in the plural number in a latticed pattern in the wafer 1. Taking an area 1B inside the wafer and an area 1C outside the wafer as an example, the detail is hereinafter described.

Figure 4A:
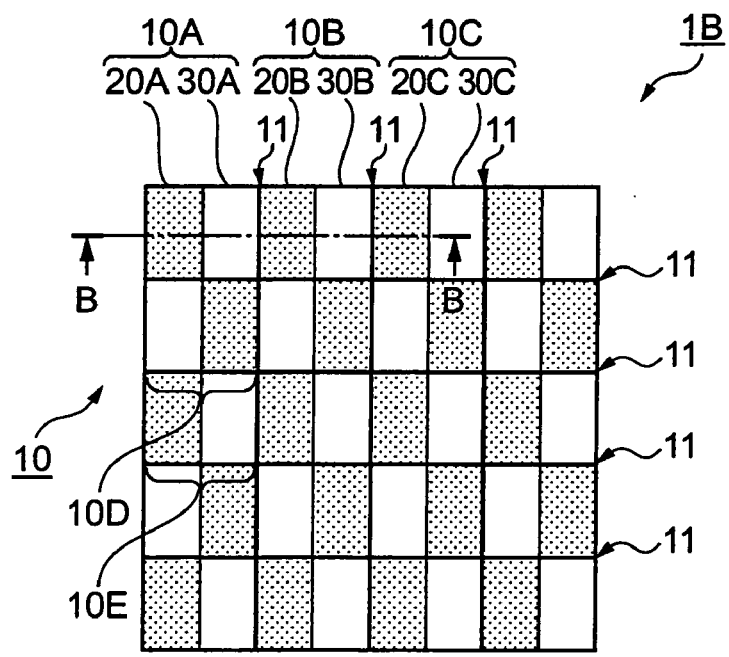
FIG. 4A is a plan view showing a layout of the surface acoustic wave element according to the first embodiment of the invention and FIG. 4B is a sectional view along the line B-B in FIG. 4A.
Figure 4B:
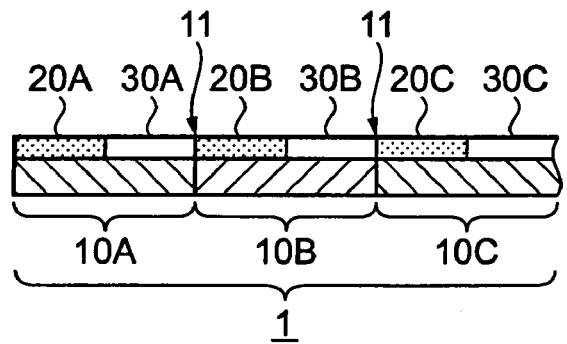

FIG. 4A is an enlarged plan view of the area 1B shown in FIG. 3 showing a layout of the surface acoustic wave element 10 and FIG. 4B is a sectional view along the line B-B in FIG. 4A. In FIG. 4A and FIG. 4B, surface acoustic wave elements 10A, 10B, 10C are provided in the upper side of the figure. A SAW region 30A is placed to be adjacent to a semiconductor wiring region 20B, contacting its one side with the one side of the semiconductor wiring region 20B. A SAW region 30B is placed to be adjacent to a semiconductor wiring region 20C, contacting its one side with the one side of the semiconductor wiring region 20C. Surface acoustic wave elements 10D and 10E are also provided along with the surface acoustic wave element 10A in the vertical direction in the figure. In each element, the semiconductor wiring region and the SAW region are provided so as to be adjacent each other. In other words, the semiconductor wiring regions and the SAW regions are provided in a checkered pattern.

The surface acoustic wave elements are simultaneously formed and arranged as described above by a semiconductor forming process that is hereinafter described with reference to FIG. 5. Each surface acoustic wave element is then separated by dicing the wafer along with a dicing line 11.

FIGS. 5A through 5E are partial sectional views showing a manufacturing process of the surface acoustic wave element. FIG. 5 only shows a single surface acoustic wave element formed on the wafer 1 as a typical example.

Figure 5A:
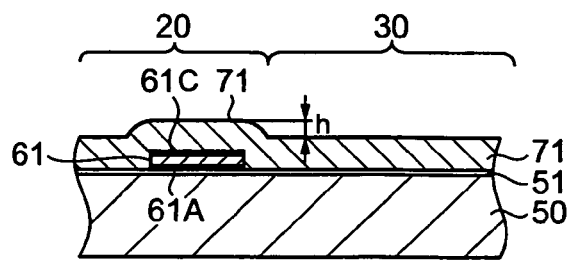
FIGS. 5A through 5E are partial sectional views showing a manufacturing process of the surface acoustic wave element according to the first embodiment.

Firstly, the BPSG layer 51 is formed on the Si layer 50 which is the semiconductor substrate and the Al wiring 61 is formed on the BPSG layer 51 as shown in FIG. 5A. Protection layers 61A and 61C for the Al wiring are formed on the both faces of the Al wiring 61. Hereinafter these protection layers 61A and 61C are also called as the Al wiring as if they are included in the Al wiring.

Next, the insulating layer 71 made of $SiO_2$ is formed in a substantially uniform predetermined thickness so as to cover the top surface of the Al wiring 61 and the surface of the BPSG layer 51. Accordingly, the top surface of the insulating layer 71 where the Al wiring 61 exists is positioned higher than the area where the Al wiring 61 dose not exist by a thickness "h".

Figure 5B:
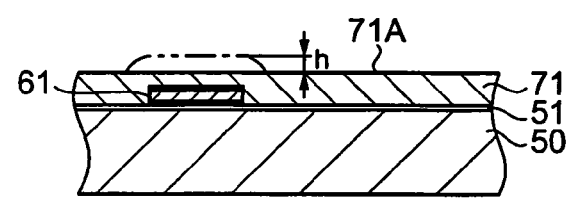

Subsequently, the protruding part of the insulating layer 71 is polished by the thickness h with the CMP, forming a flat and smooth insulating layer surface 71A that has a uniform distance from the surface of the Si layer 50 as shown in FIG. 5B. The degree of the polish may be adjusted to obtain the insulating layer surface 71A such that the insulating layer 71 is polished by further than the thickness h. However, the thickness of the insulating layer 71 from the top surface of the Al wiring 61 should be within a range in which its insulation performance will be maintained.

Figure 5C:
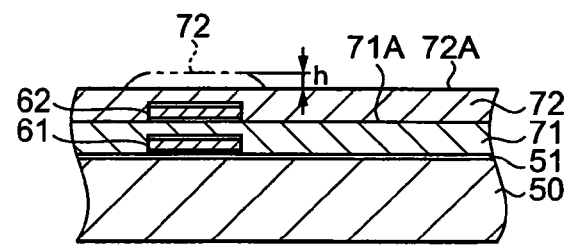

FIG. 5C shows a process of forming a second layer. The second Al wiring 62 is formed on the first insulating layer 71, and then the insulating layer 72 is formed on top of the Al wiring 62 and the first insulating layer 71 as shown in FIG. 5C. In the same way as the first insulating layer 71, a protruding part of the second insulating layer 72 on the Al wiring 62 is also polished by the CMP, forming a flat and smooth insulating layer surface 72A that has a uniform thickness.

In the same way as described above, a third and forth layers are formed.

Figure 5D:
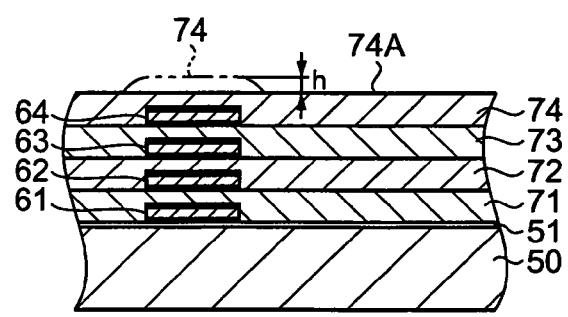

FIG. 5D is a sectional view showing the state in which the forth insulating layer 74 is formed. A protruding part (indicated as "h" in the figure) of the insulating layer 74 formed on the top surface of the Al wiring 64 is polished by the CMP, obtaining a flat and smooth insulating layer surface 74A that has a uniform distance from the Si layer 50 as shown in FIG. 5D. The protection layer 80 made of $Si_3N_4$ is formed on the whole insulating layer surface 74A (see also FIG. 5E). The protection layer 80 is a thin film having a fine structural strength and crashworthiness.

The protection layer 80 may be formed on the top face of the most upper Al wiring 64 and the insulating layer 73.

Figure 5E:
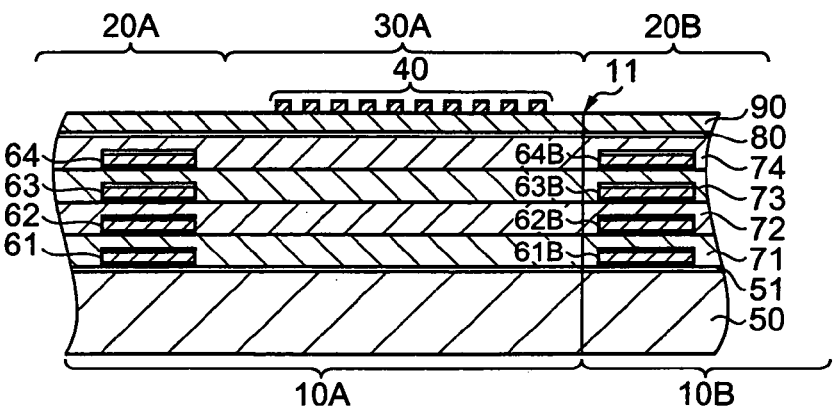

FIG. 5E is a partial sectional view along the line B-B in FIG. 4A showing the surface acoustic wave element according to the first embodiment before it is separated by dicing. The piezoelectric layer 90 is formed on the whole upper face of the protection layer 80 as shown in FIG. 5E. The IDT 40 is then formed on the SAW region of the piezoelectric layer 90. The surface acoustic wave element 10A is placed adjacent to the surface acoustic wave element 10B. The semiconductor wiring region 20B is formed in the dicing line 11 side of the surface acoustic wave element 10B. In the semiconductor wiring region 20B, Al wirings 61B-64B and the insulating layers 71-74 are also formed in the above-described process with reference to FIGS. 5A through 5D.

In the surface acoustic wave element 10 formed in the above-described way, the insulating layers 71-74 formed on throughout the semiconductor wiring region 20 and the SAW region 30 are polished by the CMP, obtaining even surfaces. However, the SAW region has smaller density (a wiring density of the Al wiring) than that of the semiconductor wiring region because the Al wirings 61-64 do not exit in the SAW region. For this reason, it is known in the semiconductor manufacturing process that a part of the insulating layer in the low density SAW region tends to be more polished when the both regions are polished at the same time by the CMP. In order to prevent this part from being excessively polished, the semiconductor wiring region is arranged in the checkered pattern in this embodiment. This is a second gist of the embodiment of the invention.

The surface acoustic wave element employing a common layout provided on a wafer of a semiconductor chip is now described with reference to the drawings. Here, the identical numerals are given to the same components and elements as those in FIG. 4A.

Figure 11A:
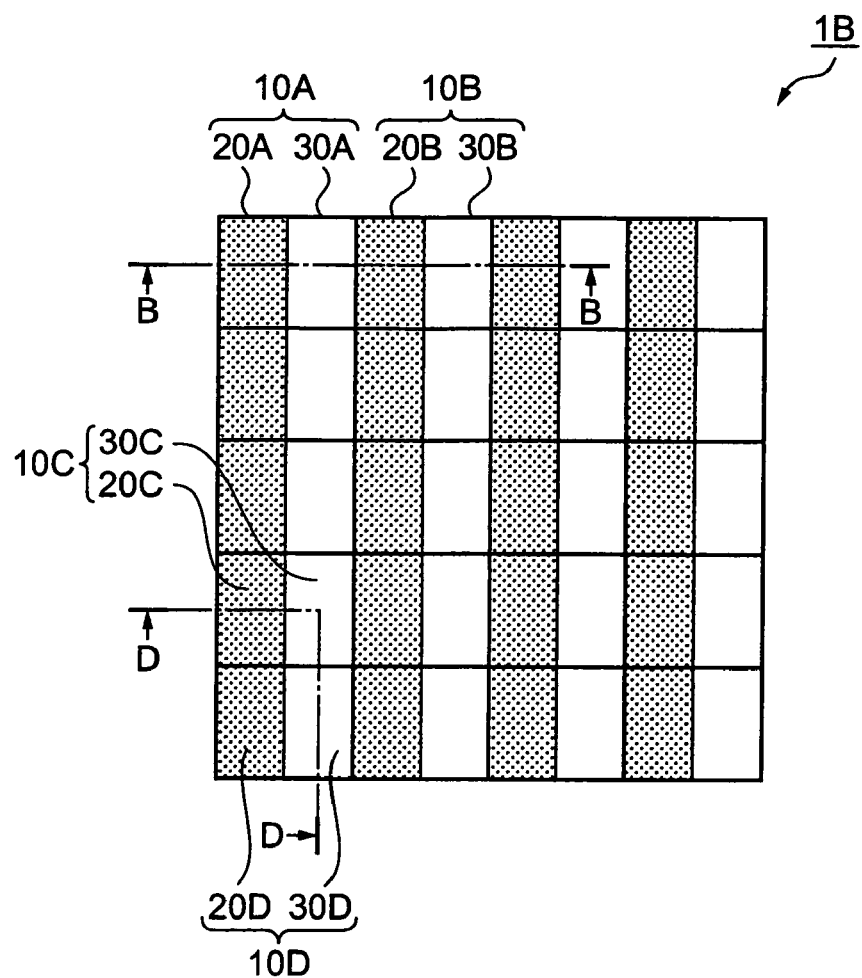
FIG. 11A is a plan view showing a hitherto known layout of a surface acoustic wave element according to other embodiment.
Figure 11B:
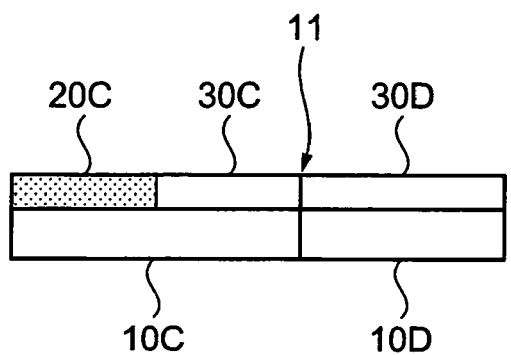
FIG. 11B is a sectional view along the line D-D in FIG. 11A.

FIG. 11A is a plan view showing a common layout of the surface acoustic wave element, and FIG. 11B is a sectional view along the line D-D in FIG. 11A. All the surface acoustic wave elements in FIG. 11A and FIG. 11B are arranged in the same direction. In other words, the semiconductor wiring region 20 and the SAW region 30 are arranged in a row in the vertical direction in the figure. The sectional configuration along the line B-B in FIG. 11A is arranged in the same way as the above-described one with reference to FIG. 4A and FIG. 4B. However, in the surface acoustic wave elements 10C and 10D that are adjacent each other in the vertical direction, the semiconductor wiring region 20C is placed adjacent to the semiconductor wiring region 20D, and a SAW region 30C is placed adjacent to a SAW region 30D. Accordingly, the SAW region has a large area that is not surrounded by the semiconductor wiring region in the vertical direction in the wafer compared to the above-described case of the checkered pattern in the first embodiment.

Next, a difference in the cross section of the surface acoustic wave element between the checkered pattern (see FIG. 4A and FIG. 4B) in the first embodiment and the above-mentioned common layout (see FIG. 11A and FIG. 11B) when the surface acoustic wave element is polished by the CMP is described with reference to FIG. 6.

Figure 6:
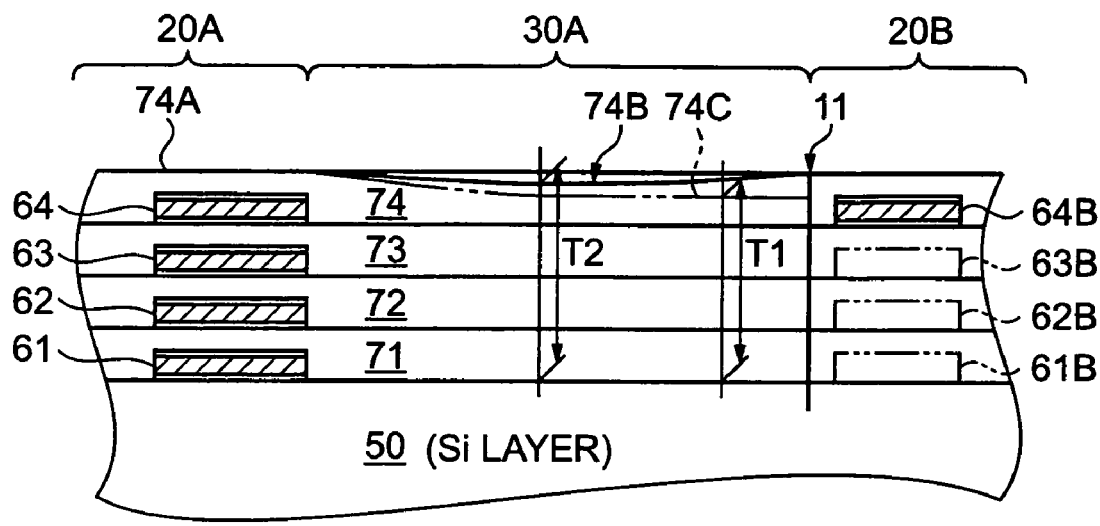
FIG. 6 is a schematic sectional view of the surface acoustic wave element according to the first embodiment.

FIG. 6 is a schematic sectional view of the surface acoustic wave element. According to the first embodiment, the surface of the most upper insulating layer 74 has a shape represented by 74B in FIG. 6 since there are the Al wirings 61-64 and the Al wirings 61B-64B on the both sides of the region as shown in FIG. 6. A minimum value of the distance (thickness) from the surface of the Si layer 50 is T2. On the other hand, according to the common layout, the SAW region has the large area which is not surrounded by the semiconductor wiring region and has a shape represented by 74C (chain double-dashed line in FIG. 6). A minimum value of the distance (thickness) from the surface of the Si layer 50 is T1.

Here, an effect of the thickness of the insulating layer on the surface acoustic wave element performance is described.

FIG. 7 is a graph showing a relation between a speed (acoustic velocity) V propagating through the surface acoustic wave element and the thickness of the insulating layer. In FIG. 7, the vertical axis is the acoustic velocity V, and the horizontal axis is "kT" which is a product of an insulating layer thickness T and a wave number "k" of the acoustic wave. Because the wave number "k" is represented by $2\pi/\lambda$ (wavelength), the wave number "k" becomes invariable when the wavelength is constant. Accordingly, "kT" plotted in the horizontal axis depends on the thickness of the insulating layer.

Therefore, when the thickness of the insulating layer is large like the thickness T2, the acoustic velocity V becomes low as shown in FIG. 7. On the contrary, when the thickness of the insulating layer is small like the thickness T1, the acoustic velocity V becomes high. The acoustic velocity V is related to a frequency "f" by "f=V/$\lambda$". Accordingly, the frequency becomes low when the thickness of the insulating layer is large, and the frequency becomes high when the thickness of the insulating layer is small.

In this way, the frequency varies depending on the thickness of the insulating layer. In order to obtain a stable frequency characteristic, it is required to form the insulating layer in a uniform thickness.

Next, a relation between the thickness of the insulating layer and a band-pass characteristic of the surface acoustic wave element when it is used as a SAW filter is described with reference to FIG. 8.

FIG. 8 is a graph showing a band-pass characteristic of the SAW filter. In FIG. 8, the vertical axis is loss (dB unit) and the horizontal axis is frequency. Graph 97 shows the band-pass characteristic of the SAW filter when the minimum thickness T1 formed by the arrangement shown in FIG. 11 exists. Graph 96 shows the band-pass characteristic of the SAW filter when the minimum thickness T2 formed by the checkered pattern arrangement according to the first embodiment exists.

It can tell from FIG. 8 that the band-pass characteristic represented by Graph 96 shows a steep peak around a center frequency band. This means that a fine filter characteristic is possibly obtained. This property of Graph 96 is obtained by improving the uniformity of the thickness by polishing the insulating layer formed under the IDT 40 by the CMP.

According to the above-described first embodiment, the semiconductor wiring region 20 and the SAW region 30 are arranged in the checkered pattern in the wafer 1 and the SAW region 30 is placed so as to be surrounded by the semiconductor wiring region 20. Accordingly, it is possible to form the flat and uniform insulating layer having the one flat plane on the semiconductor wiring region 20 and the SAW region 30 where the wiring density is different. Therefore, it is possible to provide a SAW resonator with a stable frequency characteristic and the SAW filter having a steep band-pass characteristic.

Furthermore, the surface acoustic wave elements 10 are arranged in the checkered pattern in the wafer 1 as described above. The semiconductor wiring region 20 and the SAW region 30 are separately formed so as to be arranged alongside each other on the semiconductor substrate (Si layer 50), and then the insulating layers 71-74 are polished by the CMP. Through this semiconductor manufacturing process, it is possible to form the highly uniform insulating layer with a flat one plane without increasing the number of the manufacturing process.

Second Embodiment

The surface acoustic wave element according to the second embodiment of the invention is now described with reference to the drawings. The second embodiment aims to improve the uniformity of the insulating layer thickness in the SAW region formed in the surface acoustic wave element particularly around the peripheral of the wafer while fundamentally keeping the same technical idea as that of the first embodiment.

Figure 9A:
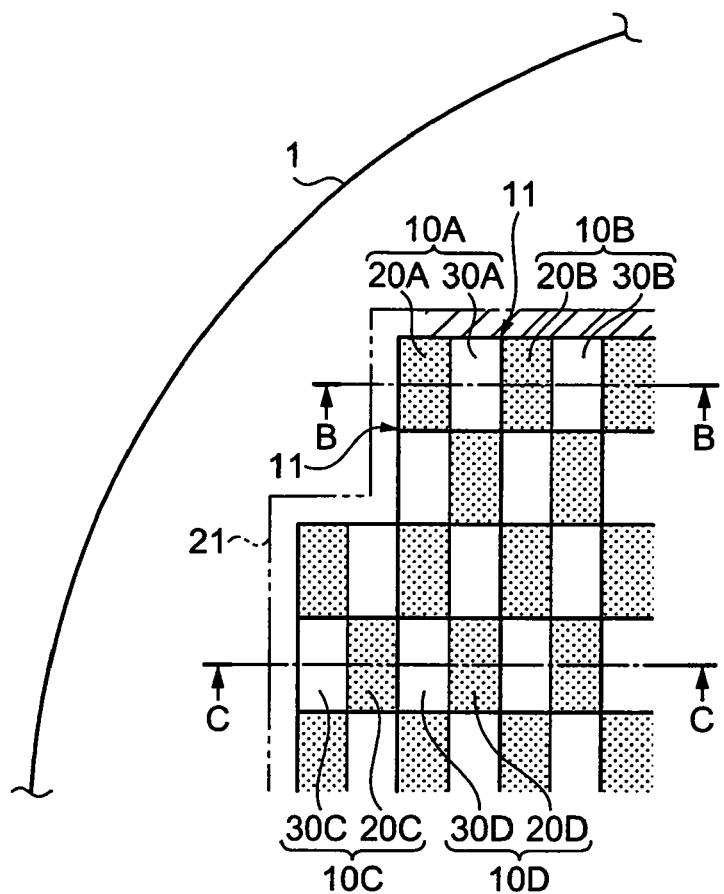
FIG. 9A is a plan view showing a layout of a surface acoustic wave element according to a second embodiment of the invention.
Figure 9B:
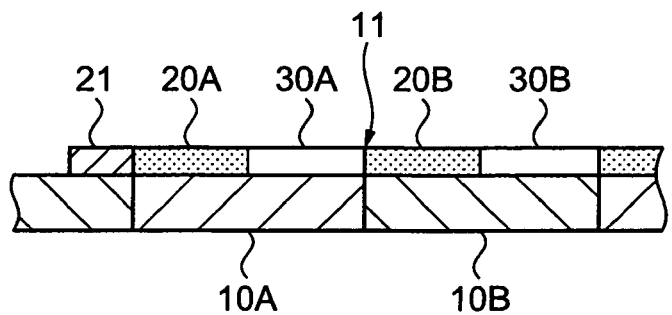
FIG. 9B is a sectional view along the line B-B in FIG. 9A.
Figure 9C:
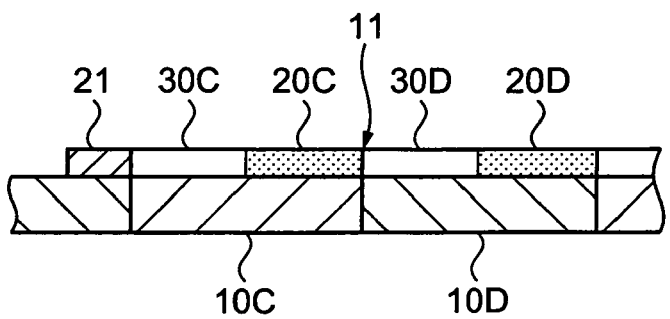
FIG. 9C is a sectional view along the line C-C in FIG. 9A.
Figure 10:
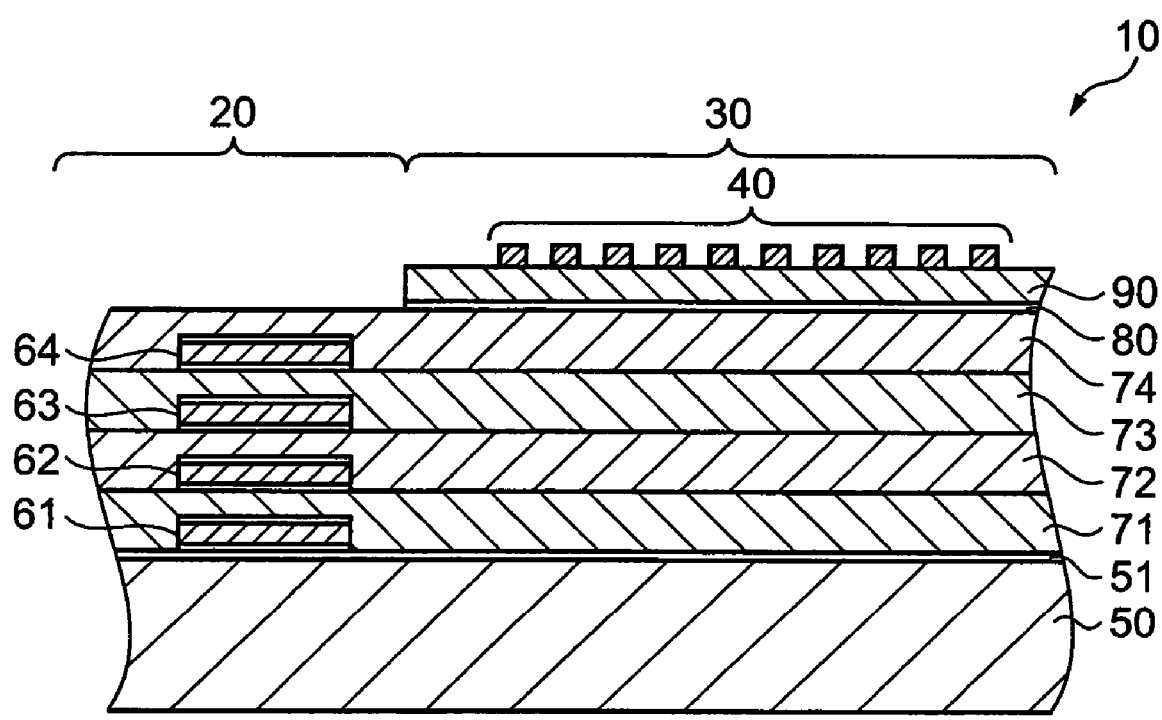
FIG. 10 is a sectional view of a surface acoustic wave element according to a third embodiment of the invention showing its structure.

FIG. 9 shows the surface acoustic wave element according to the second embodiment. FIG. 9A is a partial plan view showing a layout of the surface acoustic wave element 10 in the wafer 1 and corresponds to the area 1C shown in FIG. 3, showing it in an enlarged schematic view. FIG. 9B is a sectional view along the line B-B in FIG. 9A, and FIG. 9C is a sectional view along the line C-C. A metal wiring layer 21 is formed on the peripheral of the surface acoustic wave element 10 as shown in FIGS. 9A through 9C.

The metal wiring layer 21 is made of four Al wiring layers that are separately provided from the Al wirings 61-64 and the insulating layers 71-74 that have the same thickness. Though its manufacturing process will not be shown in the figures, the metal wiring layer 21 is formed in the same way as the above-described first embodiment (see FIG. 2). As shown in FIG. 9A, the metal wiring layer 21 having substantially the same wiring density as that of the semiconductor wiring layers 20C and 20D is formed on the peripheral of the SAW region 30A in the surface acoustic wave element 10A, the SAW region 30B in the surface acoustic wave element 10B and the SAW region 30C in the surface acoustic wave elements 10C and the like as shown in FIG. 9A.

Taking the SAW region 30A as an example, the SAW region 30A is surrounded by the semiconductor wiring region and the metal wiring layer and this becomes the same arrangement as that of the region 1B shown in FIG. 3.

This is the same status as the first embodiment. Therefore, it is possible to form most upper insulating layer having the flat and smooth surface and a highly uniform thickness in the one flat plane by performing the CMP, and the same advantageous effects as those of the first embodiment can be obtained. Furthermore, this flat, smooth and uniform plane can be formed in the surface acoustic wave element wherever the element is placed in the wafer 1. Therefore, it is possible to improve a yield ratio and reduce costs.

Third Embodiment

A third embodiment of the invention is now described with reference to the drawings. The third embodiment has the same structures as those of the first embodiment except that the piezoelectric layer 90 (see FIG. 2) is formed only in the SAW region. Therefore, the identical numerals are given to the same components and elements as those of the first embodiment and those explanations are hereinafter omitted.

FIG. 10 is a sectional view of the surface acoustic wave element 10 according to the third embodiment. As shown in FIG. 10, the protection layer 80 is formed within the SAW region 30 on the upper face of the most upper insulating layer 74. The piezoelectric layer 90 is further formed on the protection layer 80 and the IDT is formed on the upper face of the piezoelectric layer 90.

According to the structure of the third embodiment, the configuration and the manufacturing method of the Al wirings 61-64 and the insulating layer 71-74 are the same as those of the first embodiment. Therefore, the surface of the most upper insulating layer 74 becomes flat and smooth and the layer has a highly uniform thickness in the same plane. Thereby, the same advantageous effects as those of the above-described first embodiment can be obtained.

Since the piezoelectric layer 90 is formed only in the SAW region, it is possible to reduce the effect of the acoustic wave on the semiconductor wiring region 20. Accordingly, it is possible to reduce a stress given to the semiconductor wiring region when the piezoelectric layer 90 is formed.

It is preferable that the above-described first and third embodiments are combined with the above-described second embodiment.

Forth Embodiment

Next, a forth embodiment of the invention is described. The forth embodiment is a method of forming the insulating layer by spin-on glass (SOG) process. The element insulating layers 71-74 shown in FIG. 10 are often formed by a gas phase method from the requirement for higher frequency and miniaturization of wirings. However, hitherto known wirings with larger than 0.35 µm is available for a relatively low frequency such as lower than hundreds MHz. In this case, the layer can be formed less expensively if the element insulating layers 71-74 are formed by the SOG method. For example, in the SOG process, a liquid glass is applied on a wafer by spin-coat with 300 rpm of pre-rotation for 3 seconds and 3000 rpm of main-rotation for 10 seconds. The wafer is then treated in a bake furnace at 80° C. for 3 minutes and cured at 300° C. for 60 minutes. In this way, the insulating layer is formed.

Although the embodiments of the invention have been fully described by way of example with reference to the accompanying drawings, it is to be understood that the embodiments described hereunder do not in any way limit the scope of the invention but various changes and modifications will be applied within the scope and spirit of the present invention.

For example, though the surface acoustic wave elements are arranged one by one in the checkered pattern in the above-described embodiments, they may be arranged in the checkered pattern by every more than one piece.

The polished amount of the CMP could slightly vary depending on a position of the wafer. Therefore, the layout of the surface acoustic wave element may be changed depending on the position of the wafer 1 in order to keep the valance of the density.

In the above-described first embodiment (see FIG. 5B), the insulating layer 71 on the Al wiring 61 protrudes from other parts by "h" which is the thickness of the Al wiring 61, and this protruding part is polished by the CMP. However, a much thicker insulating layer may be formed and the whole surface of the insulating layer may be polished till it becomes a predetermined thickness.

In the above-described second embodiment, the metal wiring layer 21 is formed on all around the peripheral of the surface acoustic wave elements formed most outside in the wafer. However, the same advantageous effects described above can also be obtained even when the metal wiring layer 21 is formed only on a part adjacent to the outer side of the SAW region.

Furthermore, according to the above-described first through third embodiments, variation in the thickness of the insulating layer in every surface acoustic wave element provided in the wafer 1 can be minimized and besides the thickness of the insulating layer in a single surface acoustic wave element can be made uniform. Therefore, it is possible to manufacture the surface acoustic wave element with the stable frequency and band-pass characteristics, improving the yield ratio. This can contribute to cost reduction.

As described above, according to the first through third embodiments, it is possible to provide the surface acoustic wave element in which the SAW device is formed on the semiconductor substrate such as the SAW filter with the fine frequency characteristic and the SAW resonator with the fine band-pass characteristic, and to provide the manufacturing method thereof.

The entire disclosure of Japanese Patent Application Nos: 2004-348235, filed Dec. 01, 2004 and 2005-247274, filed Aug. 29, 2005 are expressly incorporated by reference herein.

What is claimed is:

1. A surface acoustic wave (SAW) element, comprising:
  a semiconductor substrate on which a semiconductor wiring region formed alongside a SAW region;
  a metal wiring formed in the semiconductor wiring region;
  an insulating layer comprising a plurality of layers, the insulator layer including internally the metal wiring, the insulator layer being formed throughout on surfaces of the semiconductor wiring region and the SAW region, a most upper layer of the insulating layer formed so as to have a one flat surface throughout the semiconductor wiring region and the SAW region and a uniform thickness from an upper face of the semiconductor substrate;
  a piezoelectric layer formed on the most upper layer of the insulating layer; and
  an inter digital transducer (IDT) formed on the piezoelectric layer in the SAW region.

* * * * *